United States Patent [19]
Hofmann et al.

[11] Patent Number: 6,132,566
[45] Date of Patent: Oct. 17, 2000

[54] APPARATUS AND METHOD FOR SPUTTERING IONIZED MATERIAL IN A PLASMA

[75] Inventors: Ralf Hofmann, San Jose; John C. Forster, San Francisco, both of Calif.

[73] Assignee: Applied Materials, Inc., Santa Clara, Calif.

[21] Appl. No.: 09/126,357

[22] Filed: Jul. 30, 1998

[51] Int. Cl.[7] .................................................. C23C 14/34
[52] U.S. Cl. ............................... 204/192.17; 204/298.06; 204/298.11; 204/192.12; 204/192.15; 204/192.22; 204/298.12; 118/723 I; 118/723 IR; 118/723 AN; 156/345; 438/731; 438/676; 438/680; 427/569
[58] Field of Search ...................... 204/298.06, 298.07, 204/298.11, 298.12, 298.13, 192.12, 192.15, 192.22; 118/723 E, 723 I, 723 IR, 723 AN, 723 ER; 156/345; 438/731, 676, 680; 427/569

[56] References Cited

U.S. PATENT DOCUMENTS

| | | | |
|---|---|---|---|
| 3,619,402 | 11/1971 | Wurm et al. | 204/298.12 |
| 3,878,085 | 4/1975 | Corbani | 204/298.19 |

(List continued on next page.)

FOREIGN PATENT DOCUMENTS

| | | |
|---|---|---|
| 0520519 | 12/1992 | European Pat. Off. . |
| 0607797 | 1/1994 | European Pat. Off. . |
| 0 782 172 | 2/1997 | European Pat. Off. . |
| 0774886 | 5/1997 | European Pat. Off. . |
| 0782172 | 7/1997 | European Pat. Off. . |
| 0801413 | 10/1997 | European Pat. Off. . |
| 61-190070 | 8/1986 | Japan . |
| 02141575 | 5/1990 | Japan . |
| 6232055 | 8/1994 | Japan . |
| 6283470 | 10/1994 | Japan . |
| 7176398 | 7/1995 | Japan . |
| 7176399 | 7/1995 | Japan . |
| 8288259 | 11/1996 | Japan . |
| 2162365 | 1/1986 | United Kingdom . |
| 2231197 | 11/1990 | United Kingdom . |
| 8606923 | 11/1986 | WIPO . |

OTHER PUBLICATIONS

U.S. Ser. No. 08/812,657 (Atty. Dkt. 1560 [5116]).

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Magnetron Sputter Deposition with High Levels of Metal Ionization," *Appl. Phys. Lett.*, vol. 63, pp. 3285–3287, 1993.

J. Hopwood et al., "Mechanisms for Highly Ionized Magnetron Sputtering," *J. Appl. Phys.*, vol. 78, pp.758–765, 1995.

S.M. Rossnagel, "Directional and Ionized Sputter Deposition for Microelectronics Applications," *Proc. of 3 rd ISSP (Tokyo)*, pp. 253–260, 1995.

N. Jiwari et al., "Helicon wave plasma reactor employing single–loop antenna," *J. of Vac. Sci. Technol.*, A 12(4), pp. 1322–1327, Jul./Aug. 1994.

(List continued on next page.)

*Primary Examiner*—Rodney McDonald
*Attorney, Agent, or Firm*—Konrad Raynes & Victor

[57] ABSTRACT

An external inductive coil is used in a plasma process system having a dielectric shield which separates the coil from the plasma. The shield includes channels provided along the inner side of the shield facing the plasma region. The channels inhibit the formation of a continuous metal film over the inner surface of the shield during sputtering and deposition. The sidewalls defining the channels permit RF transmission after the surfaces directly facing the plasma are coated with metal.

25 Claims, 6 Drawing Sheets

U.S. PATENT DOCUMENTS

| | | | |
|---|---|---|---|
| 4,362,632 | 12/1982 | Jacob | 422/186.04 |
| 4,716,491 | 12/1987 | Onho et al. | 361/230 |
| 4,842,703 | 6/1989 | Class et al. | 204/192.12 |
| 4,844,775 | 7/1989 | Keeble | 216/68 |
| 4,865,712 | 9/1989 | Mintz | 204/298.16 |
| 4,918,031 | 4/1990 | Flamm et al. | 438/695 |
| 4,925,542 | 5/1990 | Kidd | 427/531 |
| 4,948,458 | 8/1990 | Ogle | 438/729 |
| 4,990,229 | 2/1991 | Campbell et al. | 204/298.06 |
| 5,091,049 | 2/1992 | Campbell et al. | 216/37 |
| 5,122,251 | 6/1992 | Campbell et al. | 204/298.06 |
| 5,146,137 | 9/1992 | Gesche et al. | 315/111.21 |
| 5,178,739 | 1/1993 | Barnes et al. | 204/192.12 |
| 5,231,334 | 7/1993 | Paranjpe | 315/111.21 |
| 5,234,529 | 8/1993 | Johnson | 156/345 |
| 5,234,560 | 8/1993 | Kadlec et al. | 204/192.12 |
| 5,240,880 | 8/1993 | Hindman et al. | 204/192.17 |
| 5,241,245 | 8/1993 | Barnes et al. | 315/111.41 |
| 5,280,154 | 1/1994 | Cuomo et al. | 219/121.52 |
| 5,304,279 | 4/1994 | Coultas et al. | 156/345 |
| 5,346,578 | 9/1994 | Benzing et al. | 156/345 |
| 5,366,585 | 11/1994 | Robertson et al. | 216/67 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.97 |
| 5,417,834 | 5/1995 | Latz | 204/298.11 |
| 5,418,431 | 5/1995 | Williamson et al. | 315/111.51 |
| 5,429,070 | 7/1995 | Campbell et al. | 118/723 R |
| 5,429,995 | 7/1995 | Nishiyama et al. | 438/788 |
| 5,430,355 | 7/1995 | Paranjpe | 315/111.21 |
| 5,540,800 | 7/1996 | Qian | 156/345 |
| 5,540,824 | 7/1996 | Yin et al. | 204/298.34 |
| 5,560,776 | 10/1996 | Sugai et al. | 118/723 AN |
| 5,569,363 | 10/1996 | Bayer et al. | 204/192.32 |
| 5,614,055 | 3/1997 | Fairbairn et al. | 156/345 |
| 5,690,795 | 11/1997 | Rosenstein et al. | 204/192.1 |
| 5,763,851 | 6/1998 | Forster et al. | 219/121.43 |
| 5,800,688 | 9/1998 | Lantsman et al. | 204/298.11 |

OTHER PUBLICATIONS

U.S. patent application Ser. No. 08/857,921, filed May 12, 1997 (Atty. Dk. 1737).

U.S. patent application Ser. No. 08/929,965 7, filed Sep. 15, 1997 (Atty. Dk. 1798).

Search Report in PCT application Ser. No. PCT/US98/19295, filed Sep. 15, 1998.

P.M. Ryan, et al., "Methods of calculating selected geometrical effects in the design of ICRH antennas," Fusion Engineering and Design 24 (1994) 135–157.

D.W. Faulconer, "Adverse shielding of the heating field and high ohmic Isos introduced by electrostatic shields employed in radio–frequency heating of plasma," J. Appl. Phys. 54 (7), Jul. 1983.

C.M. Fortgang, "Measurements of the Electrostatic and Electromagnetic Fields of Faraday–Shielded Hlaf–Turn Loop–Type ICRF Antennae," IEEE Transactions on Plasma Science, vol. PS–13, No. 6, Dec. 1985.

M. Kwon, et al., "Measurement of the Effects of Faraday Shields on ICRH Antenna Coupling," IEEE Transactions on Plasma Science, vol. 18, No. 2, Apr. 1990.

APPARATUS AND METHOD FOR SPUTTERING IONIZED MATERIAL IN A PLASMA

FIELD OF THE INVENTION

Embodiments of the present invention relate to devices and methods for sputtering ionized material in a plasma. More particularly, embodiments relate to devices and methods for shielding a power source such as an induction coil during plasma processing.

BACKGROUND OF THE INVENTION

A number of semiconductor device fabrication procedures include processes in which a material is sputtered from a target onto a workpiece such as a semiconductor wafer. Material is sputtered from the target, which is appropriately biased, by the impact of ions created in the vicinity of the target. A certain proportion of the sputtered material may be ionized by a plasma such that the resulting ions can be attracted to the wafer. The wafer is mounted on a support and is usually biased to a DC potential selected to attract the sputtered, ionized material. Typically, the sputtered material is composed of positive ions and the workpiece is negatively biased.

There are several known techniques for exciting a plasma with RF fields including capacitive coupling, inductive coupling and wave heating. In a standard inductively coupled plasma (ICP) generator, RF current passing through a coil induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the primary winding of a transformer. The plasma acts as a single turn secondary winding of the transformer.

In certain types of deposition chambers, the chamber walls may be formed of a conductive metal such as stainless steel. Because of the conductivity of the chamber walls, the RF coil is placed within the chamber itself because the conducting chamber walls would block or substantially attenuate the electromagnetic energy radiating from the coil. As a result, the coil may be directly exposed to the deposition flux and energetic plasma particles. This is a potential source of contamination of the film deposited on the wafer, and therefore may be undesirable in some applications. To protect the coils, shields can be made from nonconducting ceramic materials. However, some deposition processes involve deposition of conductive materials such as aluminum on the electronic device being fabricated. Because the conductive material will coat the ceramic shield, the shield will become conducting, thus substantially attenuating the penetration of electromagnetic radiation into the plasma.

U.S. Pat. No. 5,346,578 describes a system in which a plasma is created for the performance of various types of wafer processing operations, including etching and chemical vapor deposition in a quartz vessel surrounded by an exterior induction coil. RF energy is transmitted from the coil through the vessel into the chamber to energize the plasma. A reactive gas is introduced into the vessel in order to be ionized by the plasma, the resulting ions being directed to a wafer under the influence of a suitable electric field. It is believed that the apparatus described in this reference is not well suited for the performance of conductive material sputtering processes because sputtered material tends to coat all interior surfaces of a vessel. As the interior surface of the vessel becomes coated with conductive material, the interior surface becomes relatively opaque to the RF energy from the coil. While it is possible to clean the interior surfaces of the vessel after deposition of conductive material, such cleaning introduces additional steps and slows down the manufacturing process.

Published European Patent Application 0607797 describes a device for generating a plasma in order to perform low pressure chemical vapor deposition or reactive ion etching operations. The system includes a processing chamber having, at its top, a planar spiral coil producing an electromagnetic field which will be coupled with a plasma within the processing chamber, the coil itself being isolated from the interior of the chamber by a flat dielectric window. The window is associated with a conductive shield which is positioned between the window and the coil. The purpose of the shield is to prevent dielectric material from being sputtered from the window. The material which is to be ionized in order to be deposited on a wafer or to perform etching is introduced into the chamber in the form of a process gas. As in the case of the apparatus described in U.S. Pat. No. 5,346,578, supra, the surface of the dielectric window which communicates with the interior of the chamber is prone to being coated with deposition material. Therefore, it is believed that this chamber is likewise not well suited to conductive material sputtering processes, because the dielectric window will become coated with the conductive material.

BRIEF SUMMARY

It is an object of embodiments of the present invention to provide an inductively coupled plasma processing apparatus which avoids drawbacks possessed by prior art processing systems.

A more specific object of embodiments of the present invention is to utilize an RF transmissive shield and an external induction coil for use in a plasma processing system which contains a metal sputtering target.

Another object of embodiments of the present invention is to protect a dielectric window forming part of the boundary of a processing chamber against deposition of sputtered material.

The above and other objects and advantages are achieved, according to certain embodiments of the present invention, by a device for shielding a coil in a processing system, the system including a plasma formation area and an induction coil for supplying energy to the plasma formation area. The device includes a shield disposed between the induction coil and the plasma formation area. The shield includes an inner surface which defines a plurality of channels. As explained in greater detail below, the channels may be shaped and positioned in such a manner as to permit deposition of conductive metal onto the shield while maintaining sufficient RF transmission through the shield to the plasma formation area.

Certain embodiments also include a device for shielding a plasma energy source from a plasma region during semiconductor processing. The device includes a dielectric shield surrounding at least a portion of the plasma region. The dielectric shield is located between the plasma region and the energy source. The shield has an inner surface and an outer surface and a plurality of channels extending along its inner surface.

Other embodiments include a method for shielding a coil from a plasma region during semiconductor processing. A shield is provided between the plasma region and the coil.

The shield includes an inner side facing the plasma region. The inner side of the shield includes a plurality of trenches.

Other embodiments include a method of processing a semiconductor workpiece in a pressure vessel. Material is sputtered material from a target, and a plurality of window portions in a dielectric wall of the pressure vessel are shielded from deposition by the sputtered material using channels formed in the dielectric wall. RF energy is coupled from an RF coil through the dielectric wall window portions to the interior of the pressure vessel to ionize at least a portion of the sputtered material and deposit ionized sputtered material onto the workpiece.

Yet other embodiments include a method for depositing titanium nitride and titanium onto a workpiece in a plasma chamber. A vacuum is provided in the chamber. A titanium target is provided in the chamber. A nitride gas is introduced into the chamber and titanium is sputtered so that titanium nitride is deposited on the workpiece. The flow of nitride gas to the chamber is stopped and titanium is deposited on the workpiece. The workpiece remains in the chamber between said steps of depositing titanium nitride and depositing titanium on the workpiece.

Yet other embodiments include a shield wall for a semiconductor processing chamber having a plasma forming coil and a plasma formation area. The wall is formed of a dielectric material transmissive to RF energy and is adapted to be disposed between the coil and the plasma formation area. The wall includes an interior side having a plurality of first surfaces and second surfaces. The first surfaces have a coating of a conductive metal material, and the second surfaces are substantially free of the conductive metal material so that the second surfaces define a plurality of RF transmissive windows through the wall.

Still other embodiments include a device for transmitting energy from an energy source to a plasma formation area after a conductive coating has been sputtered over portions of the device. The device includes shield means comprising a dielectric wall disposed between said energy sourcel and the plasma formation area. The function of the shield means is to maintain a plurality of RF transmissive windows through the dielectric wall after portions of the wall are coated with conductive material.

BRIEF DESCRIPTION OF THE DRAWINGS

Embodiments of the invention are described with reference to the accompanying drawings which, for illustrative purposes, are schematic and are not drawn to scale, where.

DETAILED DESCRIPTION

Figure 1:
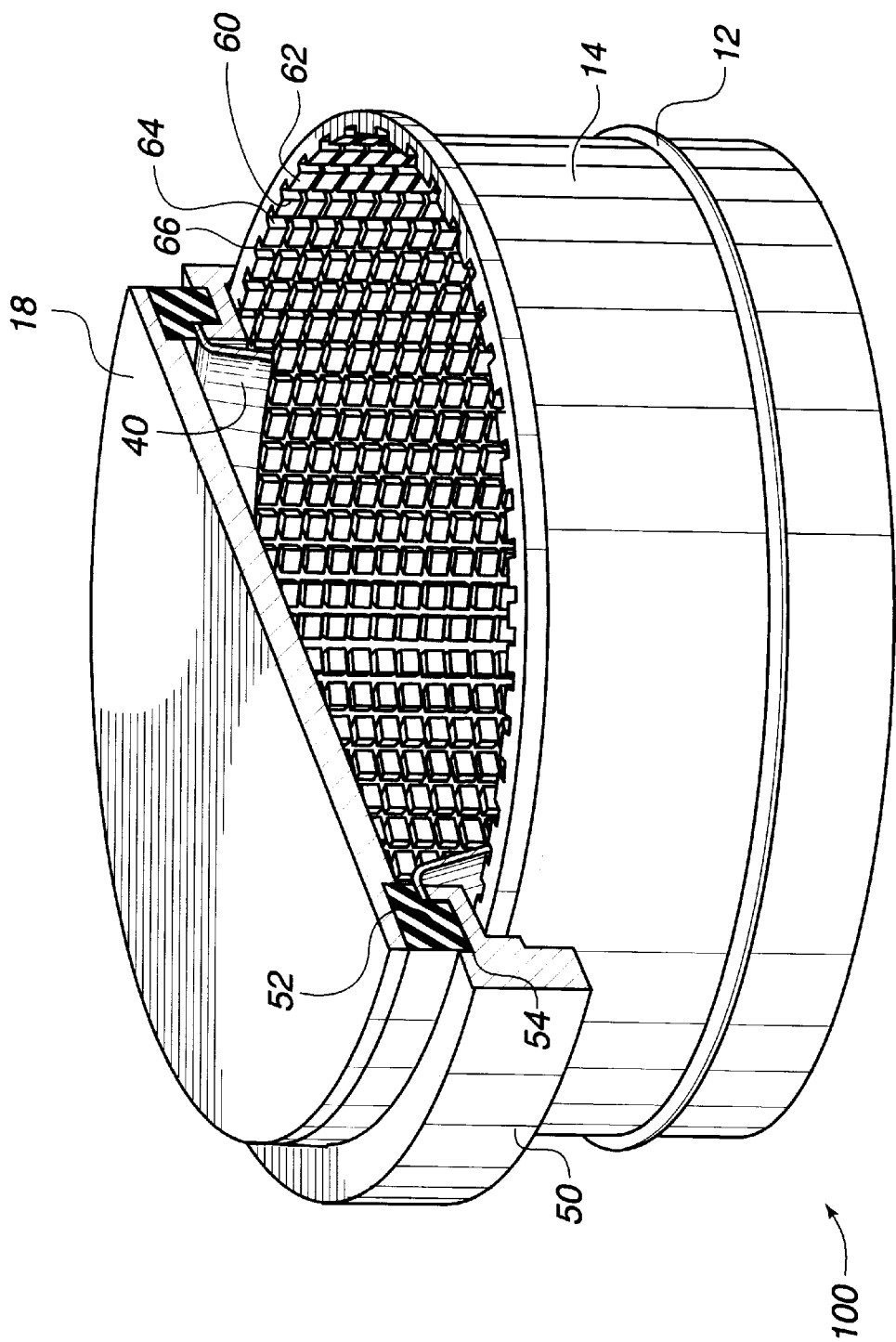
FIG. 1 is a perspective, partial cross-sectional view of a plasma generating chamber in accordance with one embodiment of the present invention.
Figure 2:
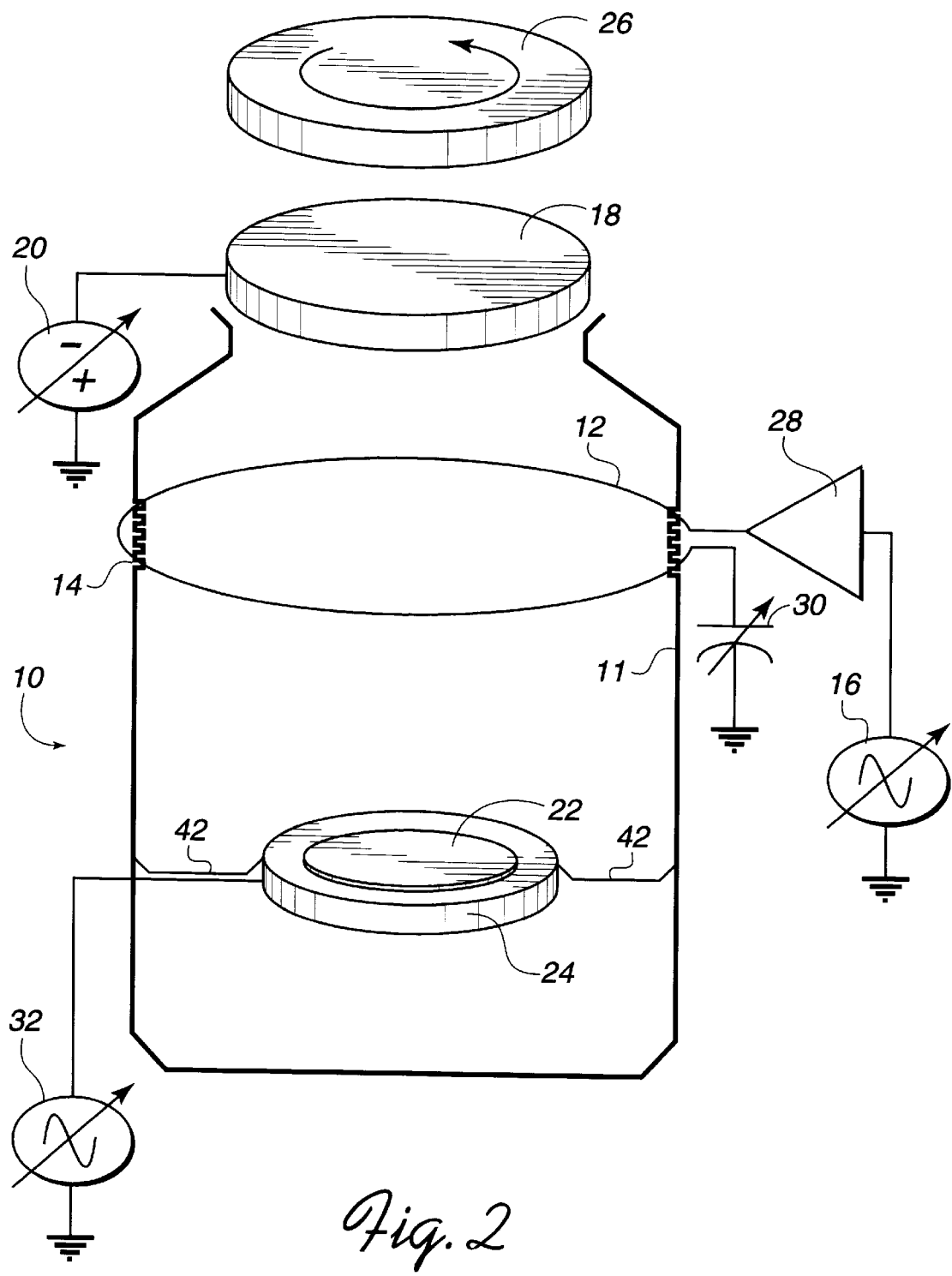
FIG. 2 is a schematic diagram which illustrates the electrical interconnections to the plasma generating chamber of FIG. 1.

Referring first to FIGS. 1 and 2, a plasma system in accordance with a first embodiment of the present invention comprises a substantially cylindrical chamber 10 which includes pressure vessel 11 (shown schematically in FIG. 2). A coil 12 surrounds a wall or shield 14. The shield 14 acts as a wall of the vessel 11 of the chamber 10 and protects the coil from the material being deposited within the interior of the chamber 10. The shield may be fabricated from an insulating material such as quartz, although other insulating materials having sufficient structural integrity to withstand vacuum conditions may be used. Suitable materials other than quartz include, but are not limited to, Pyrex, aluminum oxide, aluminum nitride, polyamide and other oxide or nitride materials and composites. Radio frequency (RF) energy from an RF generator 16 is radiated from the coil 12 into the interior of the chamber 10 through the shield 14, energizing a plasma within the chamber 10.

The target 18 is negatively biased by a DC power source 20 to attract ions which impact the target 18 and eject material from the target 18 onto a substrate 22 which may be a wafer or other workpiece. The substrate 22 is supported by a pedestal 24 at the bottom of the deposition system. A rotating magnet assembly 26 may be provided above the target 18 to produce magnetic fields which sweep over the face of the target 18 and promote a desired erosion pattern (for example, uniform erosion) of the target.

The atoms of material ejected from the target 18 are in turn ionized by the plasma being energized by the coil 12 which is inductively coupled to the plasma. The RF generator 16 is preferably coupled to the coil 12 through an amplifier and impedance matching network 28. The other end of the coil 12 is coupled to ground, preferably through a capacitor 30 which may be a variable capacitor. The ionized deposition material is attracted to the substrate 22 and forms a deposition layer thereon. The pedestal 24 may be negatively biased by an AC (or DC or RF) source 32 so as to externally bias the substrate 22 if desired.

As seen in FIG. 1, the plasma chamber 10 may have a dark space shield ring 40 which provides a ground plane with respect to the target 18 above which is negatively biased. The shield ring 40 shields the outer edges of the target from the plasma to reduce sputtering of the target outer edges. The dark space shield ring 40 performs another function in that acts as a partial barrier for the shield 14 from the material being sputtered from the target 18. The dark space shield ring 40 is not a complete barrier from all of the material being sputtered since some of the sputtered material travels at an oblique angle with respect to the vertical axis of the plasma chamber 10. However, because some of the sputtered material does travel parallel to the vertical axis of the chamber or at relatively small oblique angles relative to the vertical axis, the dark space shield ring 40 which is positioned in an overlapping fashion above the shield 14, prevents a substantial amount of sputtered material from being deposited on the shield 14. By reducing the amount of material that would otherwise be deposited on the shield 14, the shield 14 life can be enhanced.

The dark space shield ring 40 may be a closed continuous or open ring of a material such as titanium (where titanium deposition is occurring in the chamber 10) or stainless steel having a generally inverted frusto-conical shape. The dark space shield ring may extend inward toward the center of plasma chamber 10 so as to overlap the shield 14 by a distance of about ¼ inch. It is recognized, of course, that the amount of overlap can be varied depending upon the amount of shielding desired and the relative size and placement of the components in the system.

The chamber 10 further has a generally annular-shaped floor wall 42 which surrounds the chuck or pedestal 24 which supports the workpiece 22, which may have an 8" diameter in an embodiment such as that illustrated in FIG. 1. A clamp ring may be used to clamp the wafer 22 to the chuck 24 and cover the gap between the floor wall and the chuck 24. An adapter ring assembly 50 engages a portion of the plasma chamber. The dark space shield ring 40 is grounded through the adapter ring assembly 50.

The target 18 is generally disk-shaped and is also supported by the adapter ring assembly 50. However, the target 18 is negatively biased and therefore should be insulated from the adapter ring assembly 50 which is at ground. Accordingly, seated in a circular channel formed in the underside of the target 18 is an insulation ring assembly 52 which is seated in a corresponding channel 54 in the upper side of the adapter ring assembly 50. The insulator ring assembly 52, which may be made of a variety of insulative materials including, for example, ceramics, spaces the target 18 from the adapter ring assembly 50 so that the target 18 may be adequately negatively biased. The target, adapter and ceramic ring assembly are provided with O-ring sealing surfaces (not shown) to provide a vacuum tight assembly from the vacuum chamber to the target 18.

Figure 3:
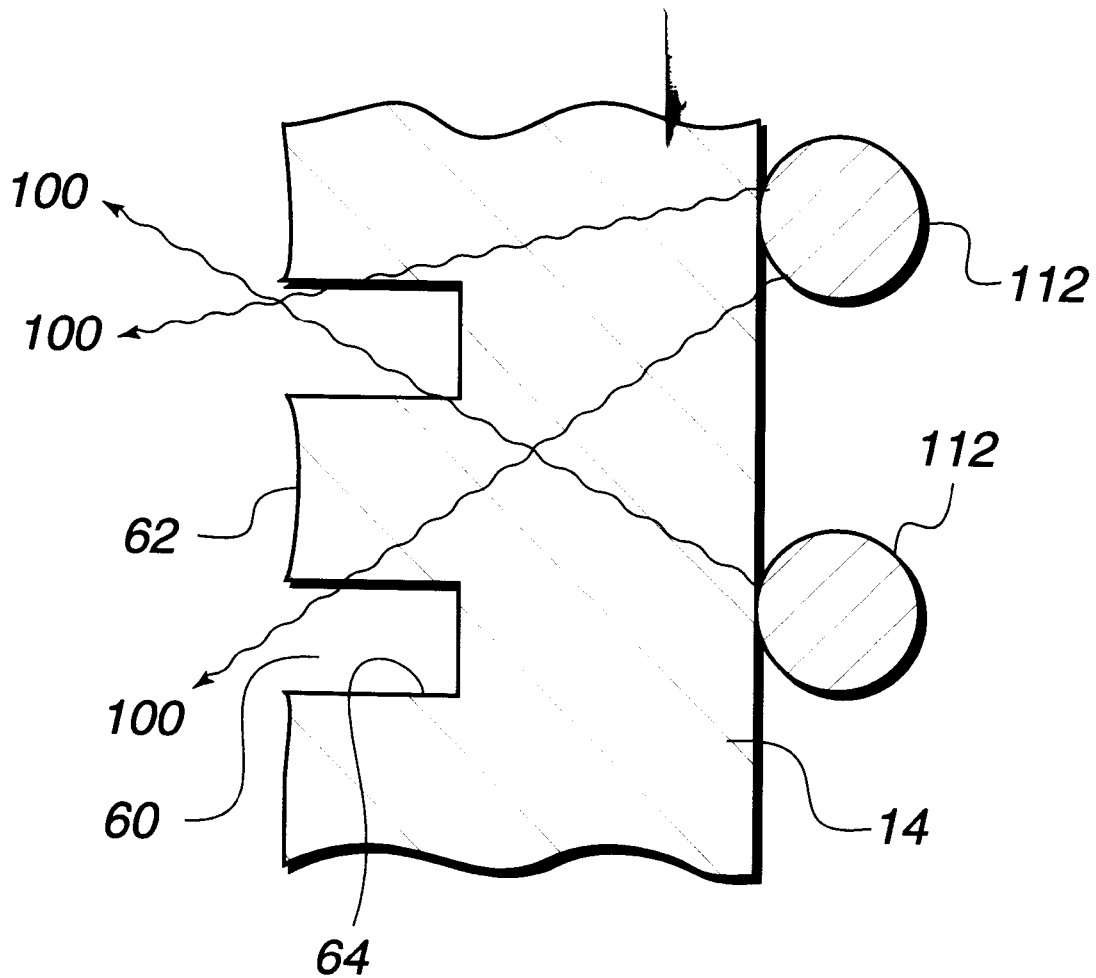
FIG. 3 is a partial cross-sectional view of a portion of a shield according to one embodiment of the present invention.

The coil 12 may be made from a variety of conductive materials such as, for example, titanium or aluminum and may have a variety of different shapes. For example, the coil may be a single turn as illustrated in FIG. 1 or multi-turn as illustrated in FIG. 3. In addition to the shapes illustrated, hollow tubing may be utilized, particularly if water cooling is desired.

The embodiment illustrated in FIG. 1 includes a single coil. It should be recognized that plasma chambers having different geometries and different coil setups such as chambers having more than one coil or multi-turn coils. For example, the present invention may be applied to multiple coil chambers for launching helicon waves.

The appropriate RF generators and matching circuits may be components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 may preferably be 2 MHz but it is anticipated that the range can vary from, for example, 1 MHz to 100 MHz. An RF power setting of 4.5 kW is preferred but a range of 1.5–5 kW is believed to be satisfactory. In some applications, energy may also be transferred to the plasma by applying AC or DC power to coils and other energy transfer members. A DC power setting for biasing the target 110 of 3 kW is preferred but a range of 2–5 kW and a pedestal bias voltage of −30 volts DC is believed to be satisfactory for many applications.

The shield 14 may vary in size depending on the chamber used and the target and workpiece size and geometry. For example, a chamber such as that illustrated in FIGS. 1–2 might utilize a shield 14 of approximately 33 cm in diameter for an 8 inch wafer but good results should be obtained so long as the shield 14 has a diameter sufficient to extend beyond the outer diameter of the target 18, the substrate support 24 and workpiece 22. The distance between the workpiece 22 and the target 18 in certain embodiments may preferably be about 140 mm but may range from about 4 to 20 cm for most chamber configurations. For this wafer to target spacing, satisfactory coverage (i.e., the ratio of aperture bottom deposition thickness to field deposition thickness) is expected with a coil diameter of about 30–35 cm.

A variety of precursor gases may be utilized to generate the plasma including Ar, $H_2$ or reactive gases such as $NF_3$, $CF_4$ and many others. Various precursor gas pressures are suitable including pressures of 0.1–50 mTorr. For ionized PVD, a pressure between 10 and 100 mTorr is preferred for best ionization of sputtered material.

As best seen in FIGS. 1 and 3, the shield 14 includes trenches or channels 60 extending along its inner surface adjacent to the plasma forming region. The channels 60 may extend along the entire length and height of the inner surface of the shield or may extend over only a portion of the inner surface. The embodiment illustrated in FIG. 1 includes two sets of parallel channels 60 intersecting each other at right angles. The channels 60 define a plurality of isolated rectangular plasma-facing surfaces 62. During a sputtering and deposition process, target 18 material will deposited throughout the deposition chamber and will coat the rectangular plasma-facing surfaces 62. If the target 18 material is a metal, then as the metal coats the shield 14, the transmission of electromagnetic radiation through the rectangular plasma-facing surfaces 62 into the plasma forming region will be somewhat attenuated. However, the channels 60 permit the flow of the electromagnetic radiation from the coil 12 through the shield 14 and into the plasma forming region even after the rectangular plasma-facing surfaces 62 are coated with conducting material.

The channels 60 are defined by sidewalls 64 and a bottom wall 66. The size, spacing and shape of the channels 60 are designed to inhibit the coating of the sidewalls 64 during the sputtering and deposition process. A variety of channel sizes, orientations, spacings, and shapes are possible. The embodiment illustrated in FIG. 1 includes channels 60 having a rectangular shape. By remaining substantially uncoated with metal, the sidewalls 64 of the channels 60 permit the radiation to penetrate through the shield 14 and into the plasma forming region. It is recognized that the bottom walls 66 and a portion of the sidewalls 64 close to the rectangular plasma-facing surfaces 62 may be coated with conducting material. However, due to geometric constraints, a substantial portion of the sidewall 64 will not be readily coated with conducting material sufficient to fully attenuate the flow of electromagnetic radiation from the coil 12 into the plasma forming region.

FIG. 3 illustrates a simplified view of the transmission through a portion of a shield 14 that occurs after the isolated rectangular plasma-facing surfaces 62 have been coated with metal during the deposition process. The waves of radiation 100 emitted by coil 112 extend through the insulating portion of the shield 14 and exit through the sidewalls 64 of the channels 60 into the plasma forming region. Thus, the sidewalls 64 of the channels 60 provide openings between the plasma-facing surfaces 62 and bottom surfaces 64 through which the radiation 100 may penetrate the shield 14.

Figure 4A:
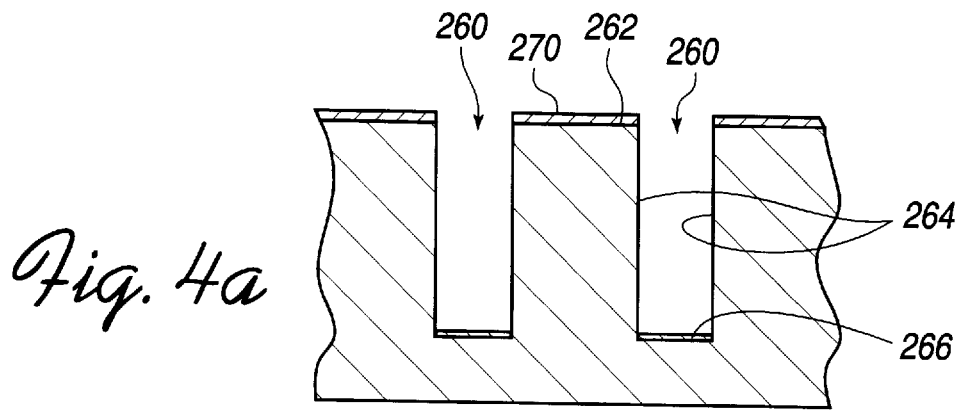
FIGS. 4a–d are partial cross-sectional views of channels in a shield according to embodiments of the present invention.

FIGS. 4a–d illustrates examples of different spacings between adjacent channels and different coatings on a shield. As shown in FIG. 4a, channels 260 are separated from one another by plasma-facing surfaces 262. The channels 260 each include sidewalls 264 and bottom wall 266. As the plasma-facing surfaces 262 (and to a lesser extent the bottom walls 266) become covered with a metal coating 270 during a deposition process, some of the radiation being transmitted by the inductive coil will be attenuated by the metal in the coating. Sufficient levels of radiation will penetrate through the shield through the channel regions 260, depending on the width of the channel, the depth of the channel and the distance between the channels 260. A simulation magnetic field computer program, "Maxwell" by Ansoft Corporation, was performed and transmission percentages through the shield were calculated for several geometries as set forth in FIGS. 4a–d and discussed below.

Figure 4B:
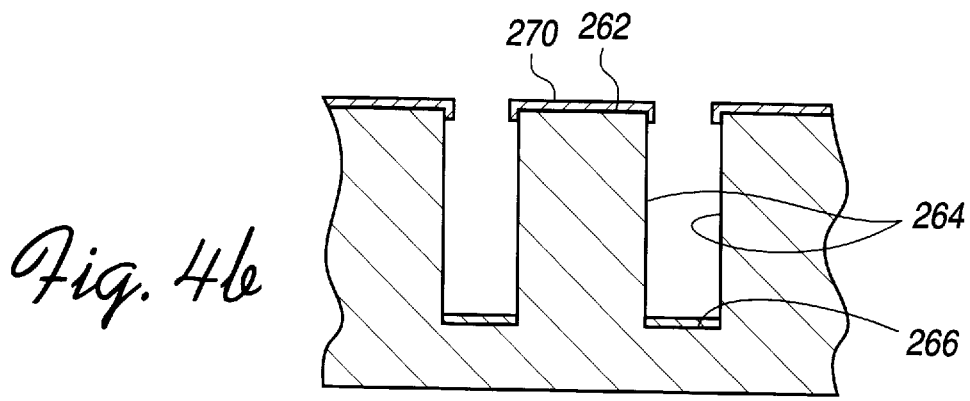
Figure 4C:
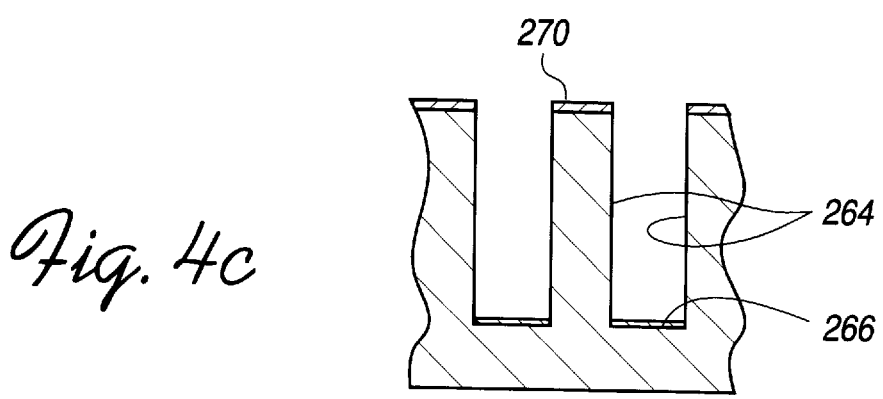

FIGS. 4a and 4b include channels 260 that are spaced 10 mm apart, 10 mm deep and 1 mm wide. It is assumed that plasma-facing surfaces 262 and bottom wall surfaces 266 directly facing the plasma formation region will be coated with conductive material 270. In FIG. 4b it is also assumed that the sidewalls 264 will be coated with conductive material 270 to a depth of 2 mm. The geometries illustrated in FIGS. 4c and 4d include channels 260 that are spaced 5 mm apart, 10 mm deep and 1 mm wide. It is assumed that the plasma-facing surfaces 262 and the bottom wall surfaces 266 of the shield of FIG. 4c are coated with conductive material 270. The example of FIG. 4d (like that of FIG. 4b) assumes that the sidewalls 264 are coated with conductive material 270 to a depth of 2 mm. The results of the simulation are set forth in Table 1 below.

TABLE I

Transmission through shields having varying channel configurations and varying depth of sidewall conductive coating as in FIGS. 4a–d using Maxwell simulation.

| FIG. | Channel Width (mm) | Channel Depth (mm) | Space Between Channels (mm) | Sidewall Coating Depth (mm) | Transmission % |
|---|---|---|---|---|---|
| 4a | 1 | 10 | 10 | 0 | 47 |
| 4b | 1 | 10 | 10 | 2 | 32 |
| 4c | 1 | 10 | 5 | 0 | 77 |
| 4d | 1 | 10 | 5 | 2 | 55 |

Figure 4D:
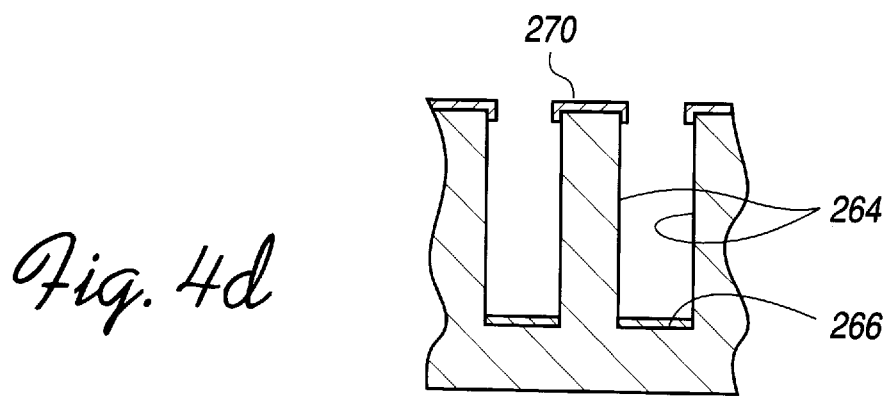

As seen in Table 1, when compared to transmission with no shield present, a shield as in FIG. 4a is calculated to have 47% transmission, a shield as in FIG. 4b to have 32% transmission, a shield as in FIG. 4c to have 77% transmission and a shield as in FIG. 4d to have 55% transmission. The transmission simulation results indicate that the transmission rates are higher when the channels are spaced closer together. However, there may be a practical lower limit to the spacing due to machining difficulties if the spacing between channels is too small. In addition, when the deposited material covers a portion of the side surfaces of the channel, the transmission rates decrease.

Figure 5:
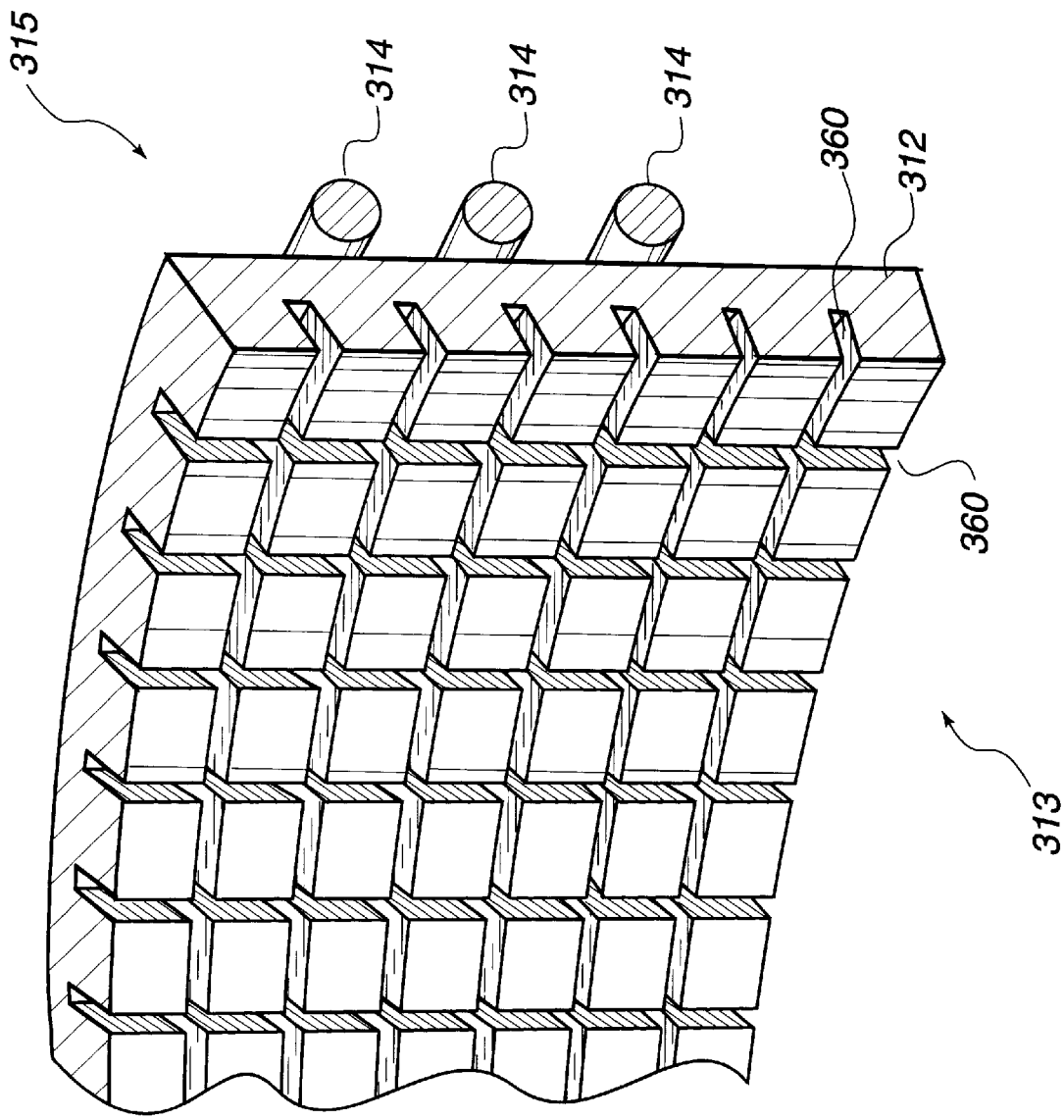
FIG. 5 is a partial view of a shield according to one embodiment of the present invention.

FIG. 5 illustrates an embodiment of the present invention including a portion of a shield 312 surrounded by a coil 314. Shield 312 may take any shape desired to separate the coil from the plasma formation region. The shield 312 may be formed from an insulating material. The shield 312 includes an inner side 313 and an outer side 315. The inner side 313 is adjacent to the region where a plasma is formed and includes a plurality of channels 360 extending along the inner side 313. In certain embodiments it is preferable for the outer side 315 to have smooth surface. In other embodiments the outer side may not be smooth and may have, for example, one or more notches to receive the coil. The shield 312 may constitute one or more walls of the pressure vessel or may be a separate shield that is placed within a pressure vessel. Appropriate O-ring sealing surfaces may be incorporated between the shield and other wall portions or chamber structures where necessary to provide a vacuum tight assembly. In certain embodiments both the shield and the coil may be wholly contained within a separate pressure vessel. While in most embodiments the openings that define the channels do not extend through the entire thickness of the shield, it may be possible for some embodiments to utilize at least some openings or slots extending through the entire thickness of the shield. Depending on the thickness of the shield, the position of the opening and other variables, the sputtered material may not be able to travel through the entire thickness of the shield and contact a coil located behind the shield. Accordingly, some embodiments may permit at least some slots extending through the entire thickness of the shield.

Figure 6:
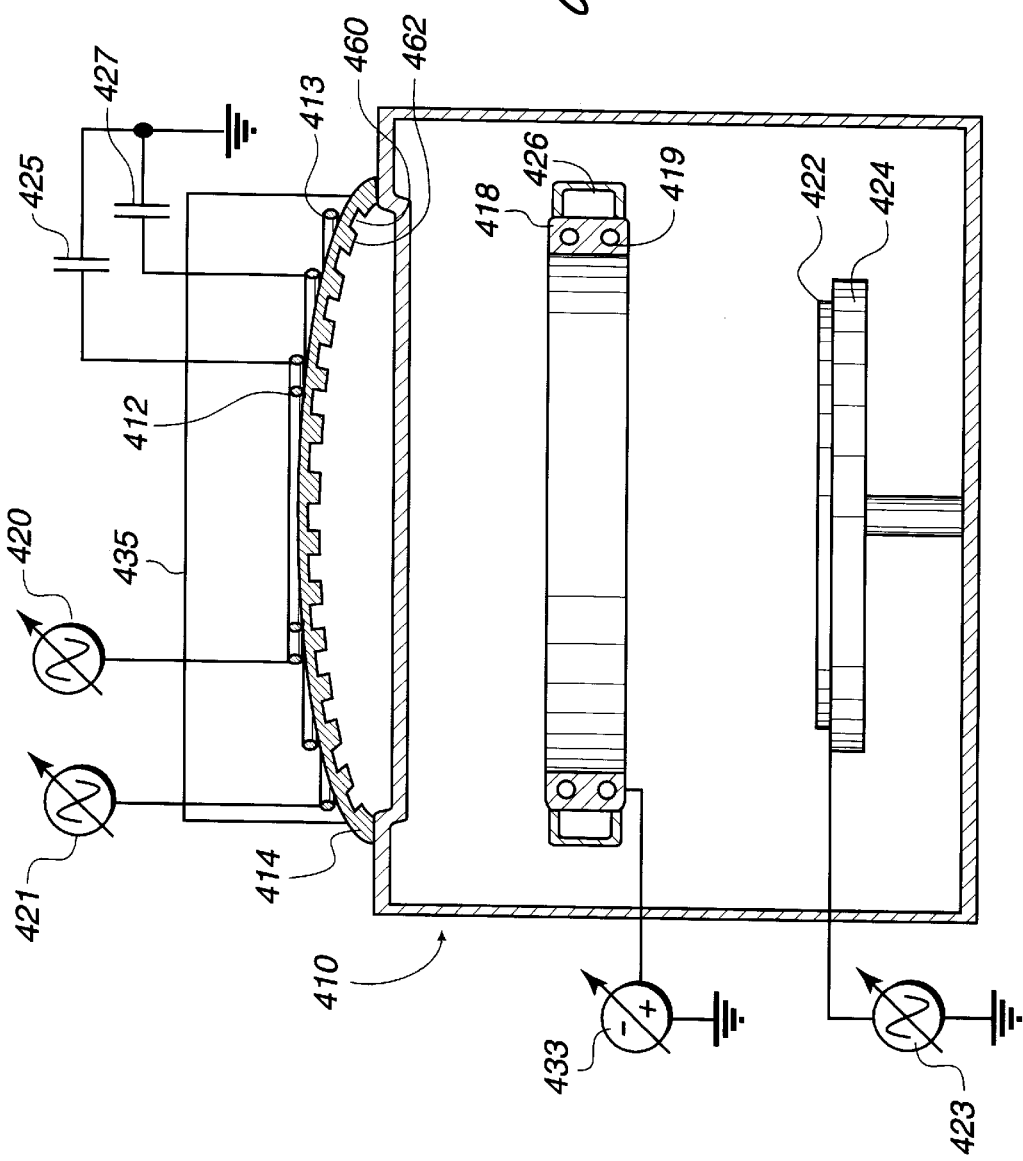
FIG. 6 is a simplified, elevational view, partly in cross section, of a plasma chamber in accordance with an embodiment of the present invention.

FIG. 6 illustrates another embodiment of the present invention in which an inductively coupled plasma ionizes material sputtered from a target for delivery to a workpiece. The processing apparatus includes a vacuum chamber 410 having at its top an opening which is closed by a dielectric shield or window 414. The window 414 permits RF energy to be transmitted from a source exterior to the sputtering chamber 410, through the window 414 and inductively coupled with the plasma in the interior of the chamber 410, notwithstanding the deposition of sputtered conductive material onto portions of the inner surface of the window 414. The dielectric window 414 may be made from a variety of insulating materials, for example, quartz, and as illustrated in FIG. 6, have a domed shape. This shape may be, for example, in the form of a segment of a sphere. Other pressure resistant shapes are also possible.

Within chamber 410 there is provided a workpiece support 424 providing a support surface. A workpiece 422 that may be constituted by one or a plurality of semiconductor wafers or panels is mounted on the support surface provided by workpiece support 424. Within chamber 410 there is mounted, in any suitable manner known in the art for conventional sputtering targets, a ring-shaped metal sputtering target 418. The target 418 may be a solid body of a sputtering material such as a metal and may be formed to have an internal helical passage 419 through which a cooling fluid can be caused to flow. The target 418 may be surrounded by a permanent magnet assembly 426 which generates a magnetic flux configured to facilitate the creation of ions adjacent to the target 418. These ions strike one or more external surfaces of target 418 in order to dislodge, or sputter, atoms or clusters of atoms from the target 418. Magnet assembly 426 may be mounted to be stationary or to rotate about a vertical center axis of chamber 410 which is concentric with target 418. The magnetic field produced by magnet assembly 426 serves to enhance ionization within the portion of the plasma field adjacent target 418 and promotes increased deposition rates and desired target etching (for example, uniform) according to principles already known in the art.

Support 424 and target 418 may be appropriately biased, in accordance with conventional practice in the art, to suitable, typically negative, potentials by AC (or DC or RF) sources 423 and 433, respectively. Although illustrated as contained wholly within the chamber 410, it is contemplated that the target 418 and assembly 426 may be mounted in the walls of the chamber 410 so that the outer portion of the target 418 and the assembly 426 are on the exterior of the chamber 410.

Above window 414 there may be mounted two conductive coils 412 and 413 which may be wound to conform to the domed shape of window 414. Coils 412 and 413 are spiral wound with respect to a vertical center axis that may be coaxial with the vertical center axis of chamber 410, with coil 412 being enclosed, or surrounded, by coil 413. One end of each of coils 412 and 413 is connected to ground via a respective DC isolation capacitor 425, 427, while the other end of each of coils 412 and 413 is connected to a suitable, adjustable RF power source 420, 421. Each RF power source 420, 421 may be of any suitable type. Coils 412 and 413 may be enclosed in an RF shielding can 435.

The surface of dielectric window 414 which faces the interior of chamber 410 contains a plurality of channels 460 separating the surface into isolated regions 462. As described above, when the isolated regions 462 are coated with metal, paths for flow of magnetic field energy from coils 412, 413 into chamber 410 will exist in the channels 460. Although some stray deposition material may deposit on the sidewall surfaces defining the channel 460, it is believed that the deposition will remain sufficiently sparse to permit substantial RF coupling through the channel regions 460. Thus the sidewall surfaces defining the channel 460 act as RF transmissive windows after the isolated regions 462 are coated. The channel width is preferably selected to be small enough to minimize the intrusion of deposition material into the channel 460 and hence minimize the coating of deposition material onto the side and inner surfaces defining the channel 460. On the other hand, the channel 460 should be sufficiently large to allow a large number of layers of successive coatings of conductive deposition material to be built up near the corners of the isolated regions 462 so that the channel is not closed off due to accumulated conductive material.

If the number of sputtering and deposition cycles reaches a level in which one or more channels in a shield begin to close or the side surfaces of the channels become sufficiently coated with conductive material to significantly hinder the transmission of radiation to the plasma forming region, the shield may be cleaned in situ or alternatively, the shield may be cleaned (by etching, for example) or replaced with a different clean shield. In some applications, partial closing of the channels may be tolerated without adversely affecting the plasma density level and hence the ionization rate of the deposition material.

Embodiments of the present invention are well suited for the deposition of multiple layers using a single chamber. For example, certain types of deposition processes may utilize an inductive coil and a chamber having walls formed from a conductive material such as stainless steel or titanium. Because of the conductivity of the chamber walls, the antenna coils or electrodes are placed within the chamber itself because the conducting chamber walls would block or substantially attenuate the electromagnetic energy radiating from the antenna. The coil and its supporting structures are directly exposed to the deposition flux and energetic plasma particles. Particles sputtered or flaked off from the coil and its supporting structures are a potential source of contamination of the film deposited on the wafer and are undesirable. For example, in a process for depositing layers of titanium nitride and titanium onto a wafer using a chamber having an internal coil, a pasting step is generally necessary after the titanium nitride deposition and prior to the titanium deposition in order to inhibit the deposition of titanium nitride material sputtered or flaked off of the coil during the titanium sputtering and deposition step. This generally requires removing the wafer from the chamber during the pasting step, in which a layer of titanium is sputter deposited over the coil in the chamber. Then the titanium sputtering and deposition step can be carried out with the substrate present. If no pasting step is carried out, then the titanium deposited onto the substrate may have a higher resistivity than desired due to titanium nitride flaking off of the coil during titanium sputtering and being deposited onto the substrate. Thus the deposition of titanium nitride and titanium layers requires numerous processing steps.

Certain embodiments of the present invention allow for the elimination of steps such as titanium pasting during a process for depositing titanium nitride and titanium layers consecutively (without the need for a pasting step) because the coil is located external to the plasma (behind the shield). Therefore, there is little or no risk of flakes from the coil being deposited onto the substrate. It is also easier to implement steps such as water cooling when using a coil that is external to the plasma formation region, because there is no risk of sputtering through the coil tubing. As a result, embodiments of the present invention permit more efficient manufacturing processes.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined by the appended claims and equivalents thereof.

What is claimed is:

1. A device for shielding a coil in a processing system, the system including a plasma formation area and an induction coil for supplying energy to said plasma formation area, the device comprising:

a shield disposed between said induction coil and said plasma formation area, said shield including an upper edge and a bottom edge, said shield defining an inner perimeter and including an inner surface which defines a plurality of channels, said shield having a thickness, wherein said channels extend partially through said shield thickness, wherein at least one of said channels extends completely around said inner perimeter of said shield, and at least one of said channels extends from said upper edge to said bottom edge.

2. A device as in claim 1, further comprising a pressure vessel, wherein said plasma formation area, induction coil and shield are disposed within said pressure vessel.

3. A device as in claim 1, further comprising a pressure vessel, wherein said shield comprises a portion of said pressure vessel.

4. A device as in claim 1, wherein said shield is annular-shaped.

5. A device as in claim 1, wherein said plurality of channels includes a plurality of horizontal channels extending completely around said inner perimeter and a plurality of vertical channels extending from said upper edge to said lower edge.

6. A device as in claim 1, wherein said channels have a rectangular shape.

7. A device as in claim 1, wherein said shield comprises an insulating material.

8. A device as in claim 1, wherein said shield is at least partially transparent to a magnetic field supplied by said coil to said plasma formation area.

9. A device as in claim 8, wherein said channels are sized and positioned to transmit a magnetic field sufficient to form a plasma in said plasma formation area after a metal has been deposited over a portion of said inner surface of said shield.

10. A device as in claim 1, wherein said inner surface of said shield comprises channel separation surfaces, channel side surfaces, and channel bottom surfaces, wherein said channel side surfaces and channel bottom surfaces are sized and spaced to permit transmission therethrough of a magnetic field sufficient to form a plasma after said channel separation surfaces are coated with a sputtered material.

11. A device as in claim 1, further comprising a target and a sputter barrier disposed between a portion of said target and said shield.

12. A device as in claim 1, wherein a first plurality of said channels extend completely around said inner perimeter of said shield, and a second plurality of said channels extend from said upper edge to said bottom edge.

13. A device for shielding a plasma energy source from a plasma region during semiconductor processing comprising:

a dielectric shield surrounding at least a portion of said plasma region, said dielectric shield disposed between said plasma region and said energy source, said shield having a shield thickness, an inner surface and an outer surface; and a plurality of channels extending along said inner surface of said shield, said channels having a channel thickness less than said shield thickness, wherein a plurality of said channels each extend completely around said plasma region.

14. A device as in claim 13, said shield further defining upper and lower edges, said device further comprising a plurality of channels extending from said upper edge to said lower edge.

15. A device for shielding a plasma energy source from a plasma region during semiconductor processing comprising:

a dielectric shield surrounding at least a portion of said plasma region, said dielectric shield disposed between said plasma region and said energy source, said shield including an inner perimeter, an inner surface and an outer surface, said shield including a plurality of slots extending partially through said shield, said shield including a lower edge portion and an upper edge portion, wherein a first plurality of said slots extend completely around said inner perimeter and a second plurality of said slots extend from said lower edge portion to said upper edge portion, wherein said first plurality of slots intersect with said second plurality of slots.

16. A method for shielding a coil from a plasma region during semiconductor processing comprising:

providing a shield between said plasma region and said coil, said shield including an inner side facing said plasma region, said inner side including a plurality of trenches therein, wherein a first plurality of said trenches is configured to extend from a top inner portion of said shield to a bottom inner portion of said shield and a second plurality of trenches is configured to extend completely around said inner side of said shield.

17. A method as in claim 16, wherein said first plurality of trenches and second plurality of trenches are configured to define a plurality of rectangular surfaces between said trenches.

18. A method of processing a semiconductor workpiece in a pressure vessel, comprising:

sputtering material from a target;

shielding a plurality of window portions in a pressure resistant dielectric wall between an interior region at a first pressure and an exterior region at a second pressure from deposition by said sputtered material using channels formed in said dielectric wall;

coupling RF energy from an RF coil through said dielectric wall window portions to the interior of said pressure vessel to ionize at least a portion of said sputtered material; and depositing ionized sputtered material onto said workpiece.

19. A method as in claim 18, wherein said sputtered material comprises a metal.

20. A method for depositing titanium nitride and titanium onto a workpiece in a plasma chamber comprising:

providing a titanium target in said chamber;

supplying energy to said chamber through a shield to a plasma generation region in said chamber, said shield including an inner top edge, an inner bottom edge, and an inner surface defining a perimeter around at least a portion of said plasma generation region, said inner surface configured to define a first plurality of channels extending completely around said perimeter and a second plurality of channels extending from said inner top edge to said inner bottom edge;

introducing a nitride gas to said chamber and sputtering titanium in said chamber so that titanium nitride is deposited on said workpiece;

stopping the flow of nitride gas to said chamber; and depositing titanium on said workpiece;

wherein said workpiece remains in said chamber between said steps of depositing titanium nitride and depositing titanium on said workpiece.

21. A shield wall for a semiconductor processing chamber for depositing a conductive coating, said chamber having a plasma forming coil and a plasma formation area, said shield wall comprising:

a wall formed of a material transmissive to RF energy, said wall being adapted to be disposed between said coil and said plasma formation area, said wall having upper and lower edges and an interior side defining a perimeter, said wall comprising a plurality of first surfaces and second surfaces, said first surfaces being positioned to receive said conductive coating, said second surfaces being positioned to be shielded from said conductive coating by said first surfaces, wherein said second surfaces define a plurality of RF transmissive windows through said wall when said first surfaces have received said coating, said RF transmissive windows extending completely around said inner perimeter of said wall and extending to said upper and lower edges of said wall.

22. A method as in claim 21, wherein said first surfaces are coated with a layer of sputtered metal and said second surfaces are substantially free of said metal.

23. A device for transmitting energy from an energy source to a plasma formation area after a conductive coating has been sputtered over portions of the device, comprising:

shield means comprising a dielectric wall disposed between said energy source and said plasma formation area, for maintaining a plurality of RF transmissive windows through said dielectric wall after a conductive coating has been sputtered over portions of said shield means;

said shield means defining an inner perimeter around said plasma formation area and including a plurality of channels extending completely around said inner perimeter.

24. A device for shielding a coil in a processing system, the system including a plasma formation area and an induction coil for supplying energy to said plasma formation area, the device comprising:

a pressure vessel including a pressure resistant shield wall between an interior region at a first pressure and an exterior region at a second pressure, said interior region including said plasma formation area, said induction coil being positioned in said exterior region, said first pressure being lower than said second pressure, said shield wall including a plurality of channels extending partially therethrough and facing said interior region.

25. A device as in claim 24, said shield wall including upper and lower edges and at least one channel extending from said upper edge to said lower edge, wherein at least one channel extends completely around said plasma formation area.

* * * * *